United States Patent
Chern

(10) Patent No.: US 8,595,673 B2
(45) Date of Patent: *Nov. 26, 2013

(54) DUMMY FILL TO REDUCE SHALLOW TRENCH ISOLATION (STI) STRESS VARIATION ON TRANSISTOR PERFORMANCE

(71) Applicant: Taiwan Semiconductor Manufacturing Company, Ltd., Hsinchu (TW)

(72) Inventor: Chan-Hong Chern, Palo Alto, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/658,098

(22) Filed: Oct. 23, 2012

(65) Prior Publication Data

US 2013/0043553 A1 Feb. 21, 2013

Related U.S. Application Data

(63) Continuation of application No. 12/684,819, filed on Jan. 8, 2010, now Pat. No. 8,321,828.

(60) Provisional application No. 61/156,344, filed on Feb. 27, 2009.

(51) Int. Cl.
*H01L 29/02* (2006.01)
*G06F 17/50* (2006.01)

(52) U.S. Cl.
USPC ............ 716/122; 716/118; 716/119; 716/123

(58) Field of Classification Search
USPC ............. 716/52, 118, 119, 122, 123; 257/499
See application file for complete search history.

(56) References Cited

U.S. PATENT DOCUMENTS

| | | | |
|---|---|---|---|
| 5,278,105 A | 1/1994 | Eden et al. | |
| 6,281,049 B1 | 8/2001 | Lee | |
| 7,484,198 B2 | 1/2009 | Lin et al. | |
| 7,600,207 B2 | 10/2009 | Moroz et al. | |
| 7,958,465 B2 | 6/2011 | Lu et al. | |
| 2009/0282374 A1 | 11/2009 | Lu et al. | |

FOREIGN PATENT DOCUMENTS

| | | |
|---|---|---|
| JP | 2000-124305 | 4/2000 |
| JP | 2007-250705 | 9/2007 |
| JP | 2008-085030 | 4/2008 |
| TW | 200421133 | 10/2004 |
| TW | 201032312 | 9/2010 |

OTHER PUBLICATIONS

Office Action dated Nov. 27, 2013 from corresponding application No. JP 2010-042808.
Office Action dated Jan. 23, 2013 from corresponding application No. TW 099105603.

*Primary Examiner* — Sun Lin
(74) *Attorney, Agent, or Firm* — Lowe Hauptman & Ham, LLP

(57) ABSTRACT

An integrated circuit includes an active layer including an active pattern diffusion region. The integrated circuit further includes at least one guard band conforming to a shape of the active layer, the at least one guard band comprising a dummy diffusion layer, wherein the guard bans is spaced from the active layer at a first constant spacing in an X-axis direction and a second constant spacing in a Y-axis direction, which is perpendicular to the X-axis direction. The integrated circuit further includes a plurality of dummy diffusion patterns outside the at least one guard band.

20 Claims, 6 Drawing Sheets

US 8,595,673 B2

DUMMY FILL TO REDUCE SHALLOW TRENCH ISOLATION (STI) STRESS VARIATION ON TRANSISTOR PERFORMANCE

CROSS REFERENCE TO RELATED APPLICATIONS

The present application is a continuation application of U.S. application Ser. No. 12/684,819, now U.S. Pat. No. 8,321,828, filed on Jan. 8, 2010, entitled "Dummy Fill to Reduce Shallow Trench Isolation (STI) Stress Variation on Transistor Performance", which claims priority from, U.S. Provisional No. 61/156,344 filed Feb. 27, 2009, entitled "Dummy Fill to Reduce Shallow Trench Isolation (STI) Stress Variation on Transistor Performance", the disclosures of which are hereby incorporated by reference herein in their entirety.

RELATED APPLICATION

This application incorporates by reference U.S. patent application Ser. No. 12/211,503, filed Sep. 16, 2008, entitled "Dummy Pattern Design for Reducing Device Performance Drift."

TECHNICAL FIELD

The disclosure relates generally to integrated circuits, and more particularly to metal-oxide-semiconductor (MOS) devices, and even more particularly to a dummy pattern design for reducing the performance drift of the MOS devices caused by differences in stresses applied on the MOS devices.

BACKGROUND

It is well known that the drive currents of metal-oxide-semiconductor (MOS) devices are affected by the stresses applied on their channel regions. The stresses in the channel regions may improve or degrade the carrier mobility depending on the direction of stresses. Generally, it is desirable to induce a tensile stress in the channel region of an n-type MOS (NMOS) device, and to induce a compressive stress in the channel region of a p-type MOS (PMOS) device, e.g. for <110> channel on (100) Si substrate.

Although the beneficial stresses in the channel regions are generally desirable, it is also realized that the magnitude of the drive current improvement is related to the magnitude of the stress. Further, an incorrect stress direction, such as compressive stress in the transverse direction, may degrade the mobility and subsequently the current, which should be minimized. On a same semiconductor chip, the MOS devices may be applied with stresses having different magnitudes. Accordingly, the drive current improvements or degradations for different MOS devices may be different, resulting in non-uniform drive currents, and hence non-uniform drive current drifts.

For each of the MOS devices in a semiconductor chip, the respective spacing from other MOS devices affects its performance. The spacing may be filled with shallow trench isolation (STI) regions (or field regions). Due to the inherent stress of the insulation materials, the STI regions apply stresses to adjacent MOS devices, and the magnitudes of the stresses are affected by the spacing. The variations in the spacing cause variations in the stresses generated by STI regions. Therefore, it is difficult to predict and compensate for the drive current drifts in circuit simulations.

The performance of MOS devices needs to be predictable, so that at circuit design time, simulations may accurately reflect the circuit behavior. Accordingly, it is preferred that in a semiconductor chip at least the MOS devices of a same type circuit have a uniform performance. In the situation of non-uniform drive current drift, the drive current drift has to be compensated for during the simulations of the circuit design. What makes the compensation of the drive current drift complicated is that the stresses of MOS devices are affected by various factors and those factors behave differently for different layouts.

Conventional integrated circuit designs, however, often neglected such issues. For example, U.S. Pat. No. 5,278,105 provides a method for adding dummy regions. The method includes extracting layouts of active layers, forming blocked regions including the patterns of the active layers, and laying out dummy patterns in regions other than the blocked regions. The primary purpose of this method is to improve diffusion density for chemical-mechanical polishing (CMP) or loading effect of etching. This method places dummy diffusion patterns randomly outside the "block" layer or "keep-out region." However, this method may have various shallow trench isolation (STI) widths even for simple rectangular diffusions as explained in the following.

FIG. 1 illustrates a conventional layout of an integrated circuit having active and dummy diffusion regions. In FIG. 1, an example layout is shown including active regions 2, 4 and 6 (active diffusion area), gate electrode strips 8, 10 and 12 (polysilicon area), and dummy regions 14 (dummy diffusion area). One skilled in the art will appreciate that the gate strips 8, 10, and 12 may be formed of materials other than polysilicon, such as metals, metal silicides, metal nitrides, polysilicon, and combinations thereof. Active region 2 and the overlying gate electrode strip 8 belong to MOS device 18, while active region 4 and the overlying gate electrode strip 10 belong to MOS device 20. It is noted that one of the dummy layer in regions 14 is spaced apart from active region 2 by spacing S1. Accordingly, the paths for applying stress (referred to as stress-application paths hereinafter) by STI regions 16 have a length S1. Similarly, one of the dummy layers in regions 14 is spaced apart from active region 4 by spacing S1. However, along another stress-application path, the stress-application path may have length S2 or S3, both different from S1. The significant difference in the lengths of the stress-application paths results in a large variation in the stresses applied by STI in region 16, and hence in a significant variation in the performance (for example, drive currents) of MOS devices 18 and 20. STI stress effect affects transistor performance parameters (such as $I_{d\text{-}lin}$, $V_t$, $I_{leak}$, $I_{d\,sat}$), and $I_{d\,sat}$ can be about 15~20% off from a Spice model of the integrated circuits. For example, with a greater stress-application length S2, STI in region 16 may apply a greater stress to the channel region of MOS device 20 than the stress applied to the channel region of MOS device 18. The device drive current drift between MOS devices 18 and 20 may reach about 10 to 20 percent.

The U.S. patent application Ser. No. 12/211,503, filed Sep. 16, 2008 and entitled "Dummy Pattern Design for Reducing Device Performance Drift" describes added dummy diffusion regions for blocking stress-application paths to reduce the variations in the stresses applied to MOS devices. One described method is to add dummy diffusion stripes parallel abutting to the "block layer" and add general dummy diffusion patterns to meet a given density target. However, even though this method can make a constant STI width for simple rectangular diffusion patterns, it fails to control STI widths for non-rectangular diffusion patterns, as explained in the following.

FIG. 2 illustrates another layout of an integrated circuit having dummy diffusion stripes and general dummy diffusion patterns. In FIG. 2, an example layout is shown including block layers 202, 204, 206, and 208, where each block layer surrounds active regions 210, 212, 214, and 216 inside, and in turn dummy diffusion stripes 218 and general dummy diffusion patterns 14 surround each block layer. For the block layer 202 and 204, the spacings between the active regions (210 and 212) and dummy diffusion stripes 218 are constant, i.e. $S_{L1}$ in the X direction and $S_{W1}$ in the Y direction. Also for the block layer 206, the spacings between the active region 214 and dummy diffusion stripes 218 are constant for each X- and Y-direction i.e. $S_{L2}$ and $S_{W2}$ respectively, due to the rectangular shape of the active region 214 inside. However, for the block layer 208, there are substantial variations in the spacings between the active region 216 and dummy diffusion stripes 218 and/or general dummy diffusion patterns 14 in both X- and Y-directions, i.e. $S_{L3}$, $S_{L4}$ and $S_{L5}$ in the X-direction, and $S_{W3}$, $S_{W4}$ and $S_{W5}$ in the Y-direction. This is due to the irregular (non-rectangular) shape of active region 216 inside the rectangular shape of the blocked region 208. The significant difference in the lengths of the stress-application paths (spacings) results in a large variation in the stresses applied by STI in region 16, and hence in a significant variation in the performance (for example, drive currents) of MOS devices inside the block layer 208.

Accordingly, new methods for well controlled STI widths or oxide definition (OD) spacing and significantly reduced device performance variations (e.g. drive current drifts) of MOS devices regardless of diffusion shapes are needed.

SUMMARY

In accordance with one or more embodiments, a method of forming an integrated circuit structure on a chip includes extracting an active layer from a design of the integrated circuit structure, where the active layer comprises an active pattern having a diffusion region; forming at least one guard band conforming to the shape of the active layer, where the guard band is a dummy diffusion layer, the guard band surrounds the active layer without a break, and the guard band is spaced from the active layer at a first spacing in the X-axis direction and at a second spacing in the Y-axis direction; removing any part of the guard band that violates design rules; removing convex corners of the guard band; and adding dummy diffusion patterns into the remaining space of the chip outside the guard band. The guard band in the method can have a uniform width or specified widths. Also, dummy diffusion patterns in the method can have different granularities in sizes. The dummy diffusion patterns can be added so that the diffusion density is substantially uniform over the chip.

In one embodiment, the method may include adding a block layer before forming the guard band, where no dummy diffusion layers are added inside the block layer. In another embodiment, the first spacing can be specified as the same spacing in the X-direction used in a Spice model characterization of the integrated circuit structure and/or the second spacing can be specified as the same as the spacing in the Y-direction used in a Spice model characterization of the integrated circuit structure. In yet another embodiment, the method may include cutting the guard band longer than a specified length, where the length is determined by design rules.

In accordance with one or more embodiments, a method of forming an integrated circuit structure on a chip includes extracting an active layer from a design of the integrated circuit structure, where the active layer comprises an active pattern having a diffusion layer; forming at least one guard band conforming to a shape of the active layer, where the guard band is a dummy diffusion layer, the guard band surrounds the active layer, and the guard band is spaced from the active layer at a first spacing in the X-axis direction and at a second spacing in the Y-axis direction, and there is no guard band at locations where convex corners are necessary in order to have a continuous guard band; and adding dummy diffusion patterns into the remaining space of the chip outside the guard band.

The advantageous features of the present disclosure include well controlled STI widths or oxide definition (OD) spacing of devices, actual diffusion patterns having the same X- and Y-diffusion spacings as a Spice model characterization spacings if the same spacings are specified, and significantly reduced device performance variations due to reduced STI stress effect variations regardless of diffusion shapes, as well as reducing the gap between pre-layout and post-layout simulation and maximizing Silicon versus simulation correlations.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative, and do not limit the scope of the present disclosure.

A method of inserting dummy patterns into layouts of integrated circuits is provided. The intermediate stages of the method are provided, and the variations of the method are also discussed. Throughout the various views and illustrative embodiments of the present disclosure, like reference numbers are used to designate like elements.

Figure 1:
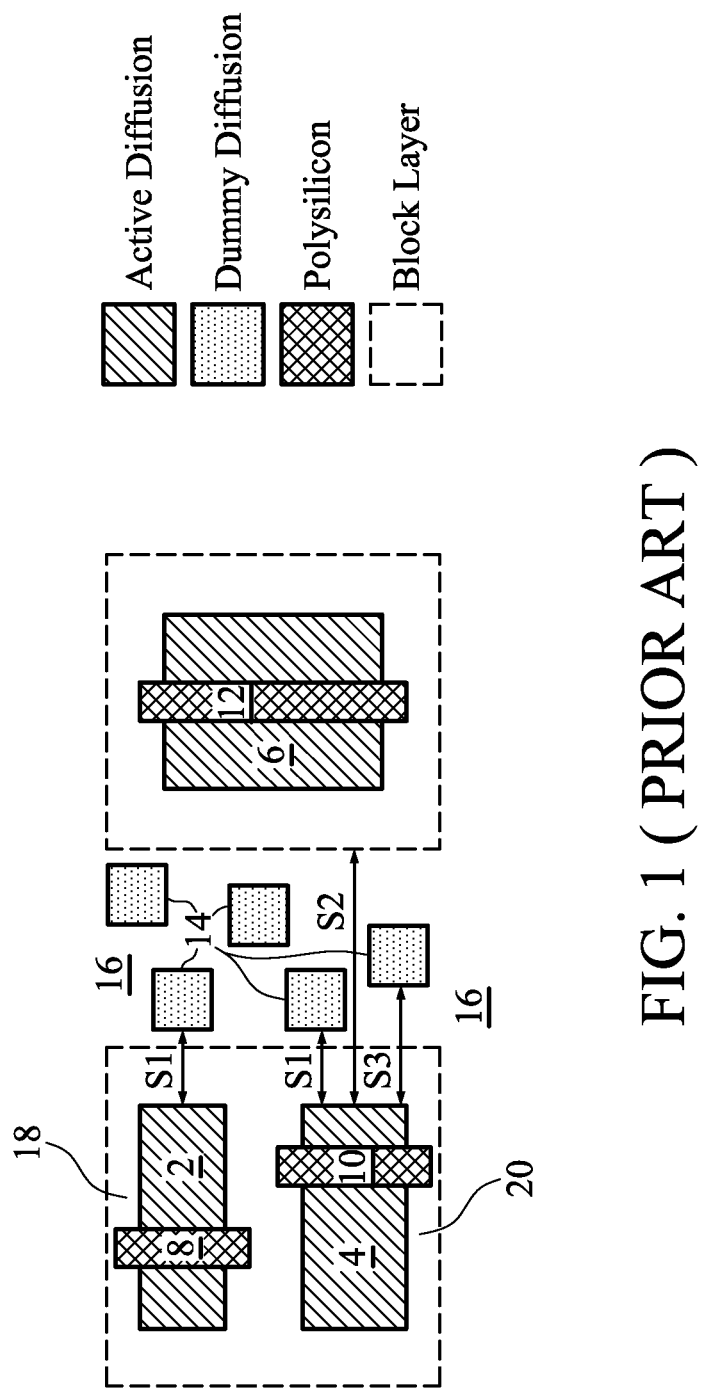
FIG. 1 illustrates a conventional layout of an integrated circuit having active and dummy diffusion layers.
Figure 2:
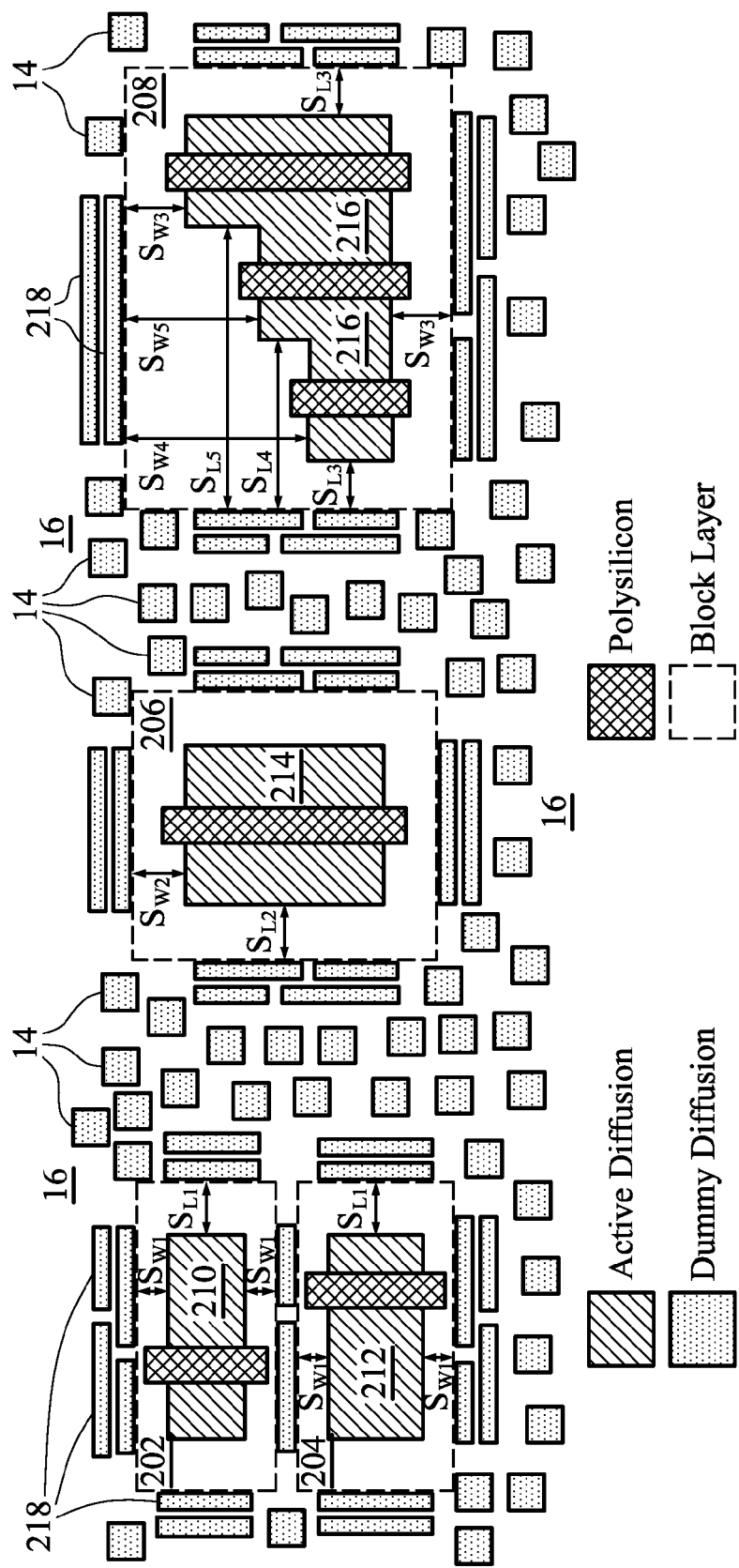
FIG. 2 illustrates another layout of an integrated circuit having dummy diffusion stripes and general dummy diffusion patterns.
Figure 3:
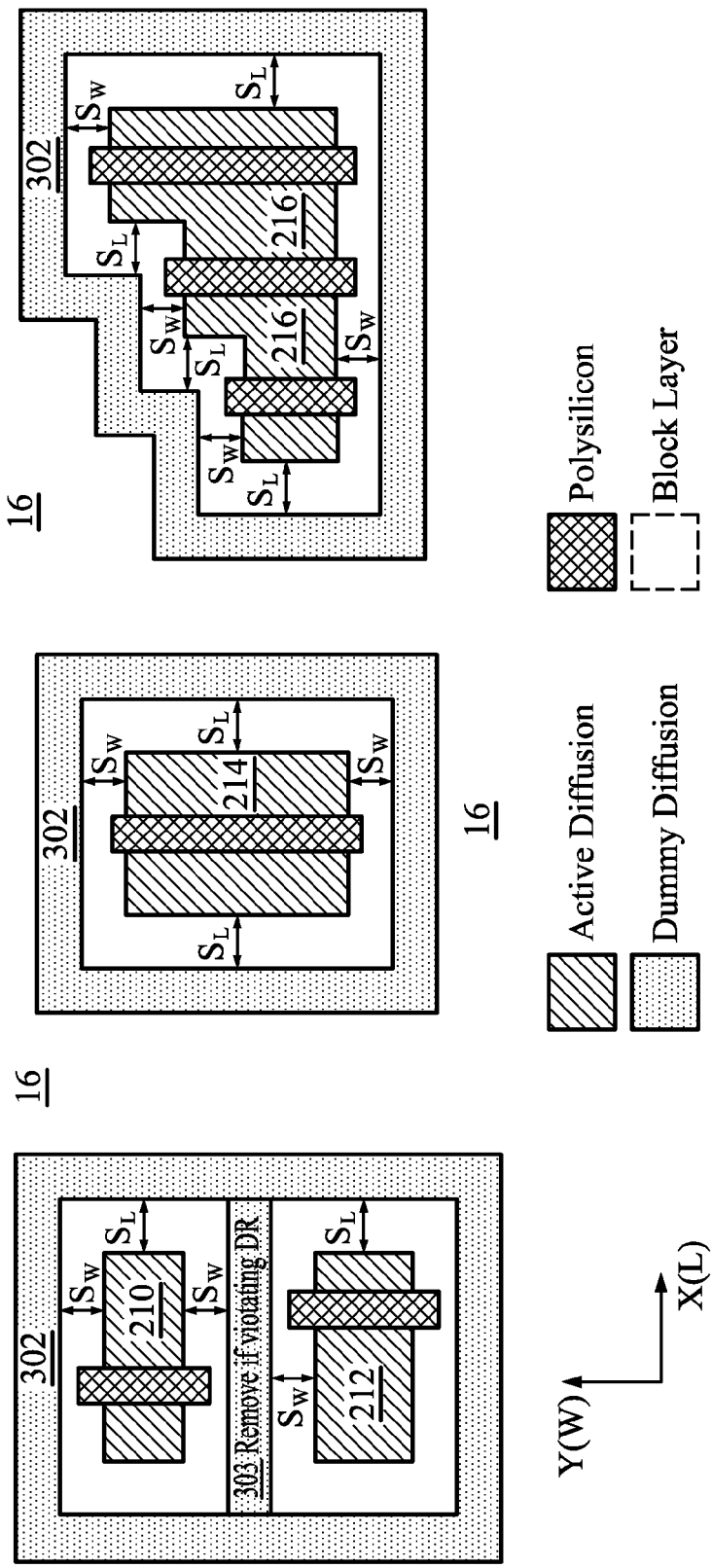
FIG. 3 illustrates an example layout according to one aspect of the disclosed embodiments, having guard bands conforming to the shapes of the active diffusion layers.

FIG. 3 illustrates an example layout according to one aspect of the disclosed embodiment, having guard bands conforming to the shapes of the active layers. The guard bands are dummy diffusion layers surrounding active layers. In FIG. 3, active layers including active diffusion regions 210, 212, 214, and 216 (extracted from a design of the integrated circuit structure), are surrounded by guard bands 302 that are conforming to the shapes of the active layers. The guard bands 302 surround the active regions without a break and are spaced from the active regions at a spacing $S_L$ in the X-axis direction and at a spacing $S_W$ in the Y-axis direction.

The guard bands 302 have a uniform width in correlation with a Spice model or various specified widths for device matching. The region 303 is an example of a portion of the guard band 302 that is removable if it violates design rules (DR). As shown in FIG. 3, the spacing between the active regions (210, 212, 214, and 216) and the guard bands (302) are constant for each direction, i.e. $S_L$ in the X-axis direction and $S_W$ in the Y-axis direction. Therefore, the guard bands are placed at specified spacings from the active regions regardless of the shape of the active regions, i.e. whether rectangular or not.

In one embodiment, the spacing $S_L$ in the X-direction can be specified as the same spacing in the X-direction used in a Spice model characterization of the integrated circuit structure. Similarly, the spacing $S_W$ in the Y-direction can be specified as the same as the spacing in the Y-direction used in a Spice model characterization of the integrated circuit structure. The advantage of this embodiment is that the actual diffusion patterns will have the same X- and Y-diffusion spacings as Spice model characterization spacings of the integrated circuit structure, thus helping to more accurately match simulation and fabrication of the integrated circuits, as well as significantly reducing the gap between post-layout and pre-layout simulation results.

Figure 4:
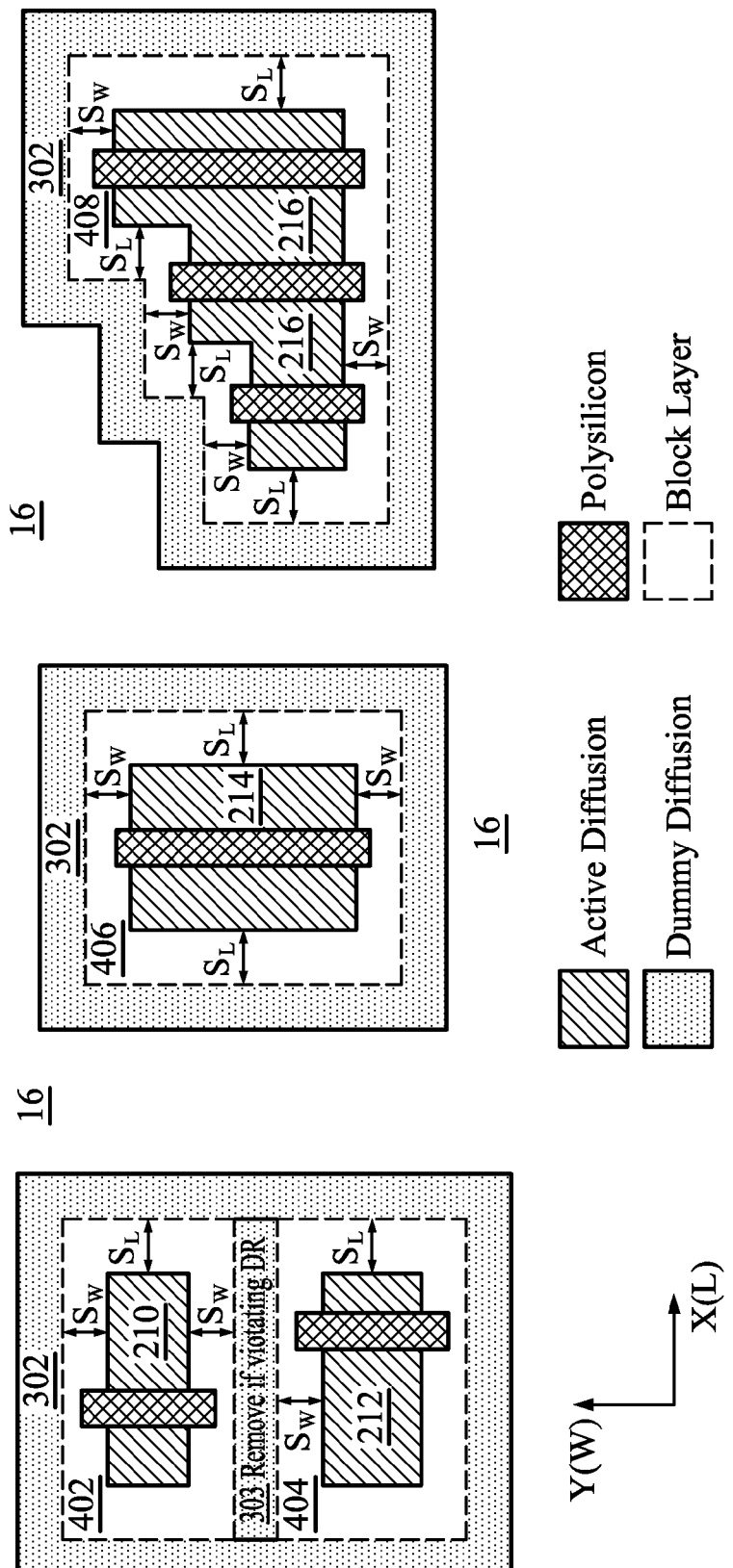
FIG. 4 through 6 are top views of intermediate stages according to one aspect of a method of adding dummy diffusion patterns, where the guard bands are conforming to the shapes of the active layers, and block layers are used to keep out dummy diffusion patterns at specified spacings from active layers.
Figure 5:
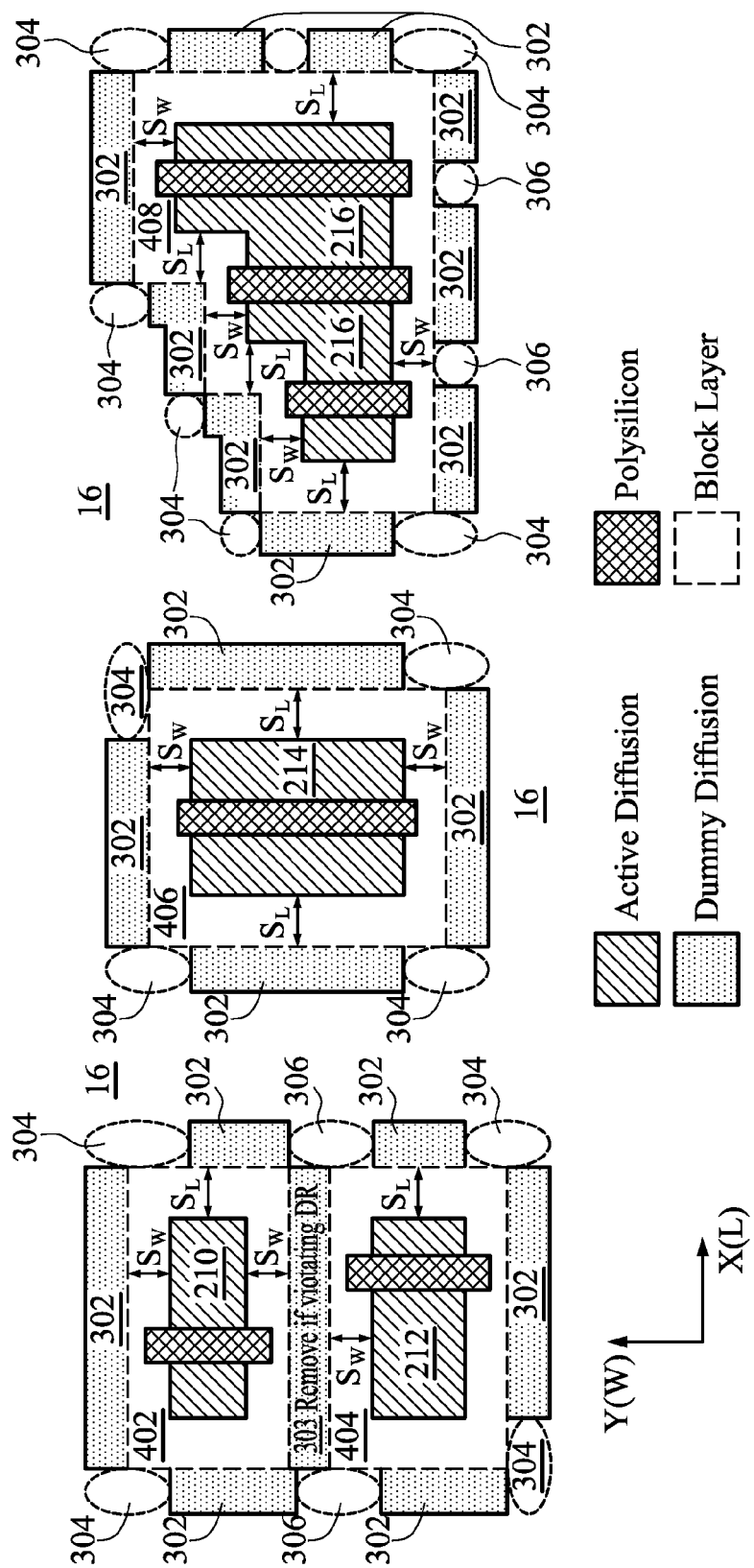
Figure 6:
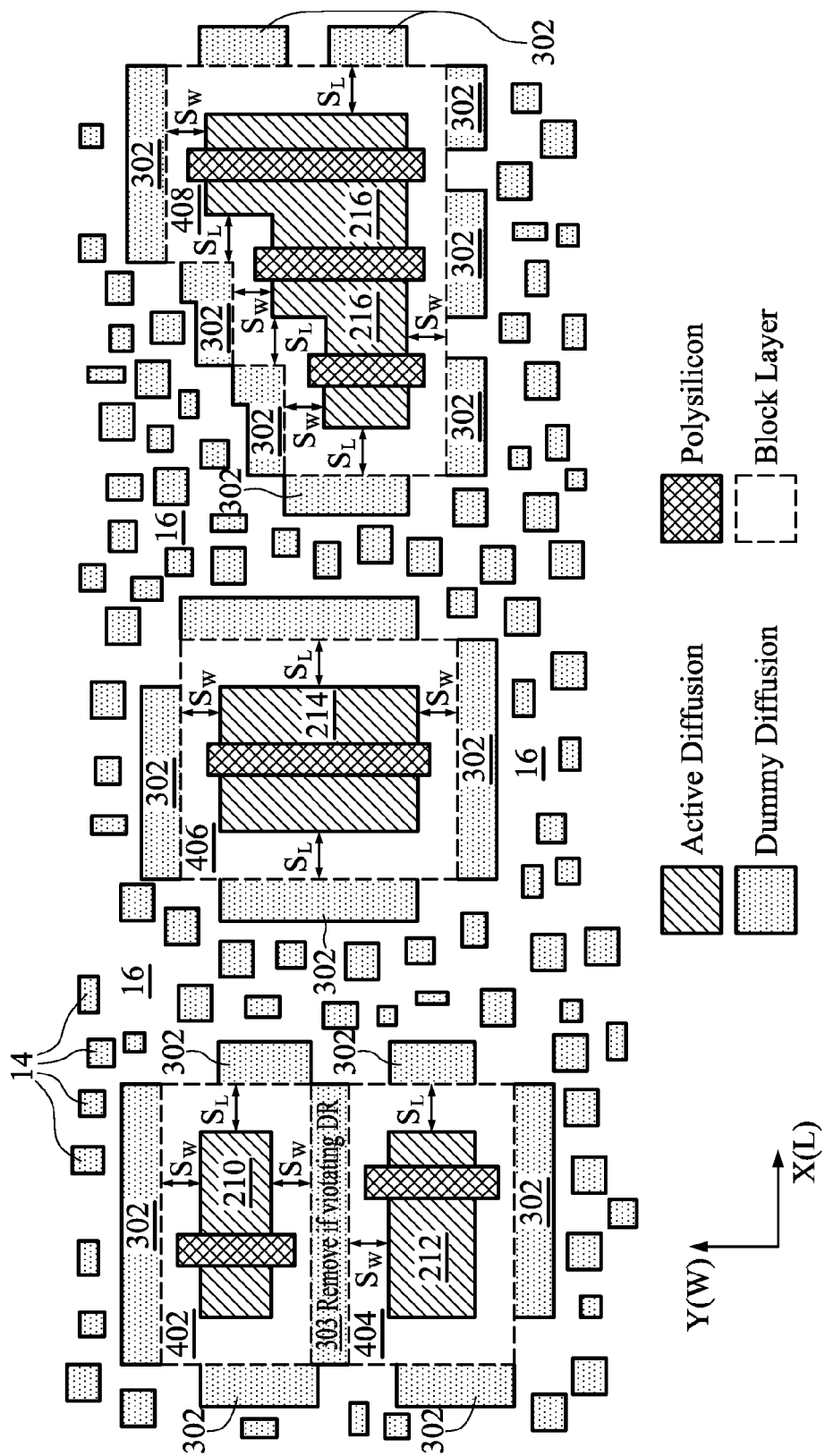

FIG. 4 through 6 are top views of intermediate stages according to one aspect of a method of adding dummy diffusion patterns, where the guard bands are conforming to the shapes of the active layers, and block layers are used to keep out dummy diffusion layers at specified spacings from active layers.

FIG. 4 shows the same layout as FIG. 3, except that block layers 402, 404, 406, and 408 (dotted lines) are used to keep out dummy diffusion layers at specified spacings from active layers. The block layers (402, 404, 406, and 408) may be used as in FIG. 4 according to one embodiment, or the guard bands 302 may be placed without using block layers as in FIG. 3 according to another embodiment. The block layers (402, 404, 406, and 408) are added before forming the guard bands 302, and no dummy diffusion patterns are added inside the block layer.

FIG. 5 shows the step of removing convex corners of the guard bands and the step of cutting the guard band longer than a specified length from the layout in FIG. 4. Guard band convex regions 304 show convex corners of guard bands 302 originally shown in FIG. 4. The guard band convex regions 304 are removed to avoid diffusion rounding, which could affect the spacing and avoid too long diffusion length, which could violate design rules. The cutting does not affect the spacing. Guard band cutout regions 306 show cutout part of the guard bands 302 originally shown in FIG. 4, because of the longer length than a specified length for guard bands, where the length is determined by design rules. The design rules restrict the length of diffusion regardless of its location, but the diffusion should not be cut at locations that result in changing the spacing.

In accordance with another aspect of the embodiment, the guard bands 302 conforming to the shapes of the active layers 402, 404, 406, and 408 can be placed, where the guard bands surround the active layers, the guard bands are spaced from the active layers at a first spacing $S_L$ in the X-axis direction and at a second spacing $S_W$ in the Y-axis direction, and there is no guard band at locations where convex regions 304 are necessary in order to have a continuous guard band. This eliminates the step of removing the convex regions 304 shown in FIG. 5 because the convex regions 304 are not placed in the first place. Likewise, the guard bands 302 can be placed so that the length of guard bands 302 are equal to or less than a specified length, so that there is no need to cut the guard bands at regions 306 as shown in FIG. 5, because the regions 306 are not placed in the first place.

FIG. 6 shows the step of adding dummy diffusion patterns from the layout shown in FIG. 5. The general dummy diffusion patterns 14 are added in the remaining space of the chip outside the guard band. The general dummy diffusion patterns 14 have different granularities as shown in FIG. 6 according to one embodiment, and may have the same granularity in another embodiment. Also, the general dummy diffusion patterns 14 can be added so that the diffusion density is substantially uniform over the chip.

The advantageous features of the embodiments include well-controlled STI widths or oxide definition (OD) spacing of devices, actual diffusion patterns having the same X- and Y-diffusion spacings as a Spice model characterization spacings if the same spacings are specified, and significantly reduced device performance variations due to STI stress effect variations regardless of diffusion shapes.

One aspect of this description relates to an integrated circuit structure on a chip. The integrated circuit includes an active layer comprising an active pattern diffusion region. The integrated circuit further includes at least one guard band conforming to a shape of the active layer, the at least one guard band comprising a dummy diffusion layer, wherein the guard bans is spaced from the active layer at a first constant spacing in an X-axis direction and a second constant spacing in a Y-axis direction, which is perpendicular to the X-axis direction. The integrated circuit further includes a plurality of dummy diffusion patterns outside the at least one guard band.

Another aspect of this description relates to an integrated circuit structure on a chip. The integrated circuit includes a plurality of active layers, each active layer comprising an active pattern having a diffusion region. The integrate circuit further includes a plurality of guard bands, at least one guard band of the plurality of guard bands conforming to a shape of each active layer, wherein each guard band is a dummy diffusion layer, each guard band surrounds the active layer without a break, each guard band is spaced from the active layer at a first constant spacing in a X-axis direction and at a second constant spacing in a Y-axis direction, and each guard band has a length less than a specified length. The integrate circuit further includes a plurality of dummy diffusion on the chip outside the guard band.

Still another aspect of this description relates to an integrated circuit structure on a chip. The integrate circuit includes an active layer comprising an active pattern having a diffusion region. The integrate circuit further includes at least one guard band conforming to a shape of the active layer, wherein the guard band is a dummy diffusion layer, the guard band surrounds the active layer, the guard band is spaced from the active layer at a first constant spacing in a X-axis direction and at a second constant spacing in a Y-axis direction, and the at least one guard band is free of convex corners. The integrate circuit further includes a plurality of dummy diffusion patterns in a space of the chip outside the at least one guard band.

Although the embodiments and their advantages have been described in detail, it should be understood that various changes, substitutions and alterations could be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A chip having an integrated circuit structure comprising:
   an active layer comprising an active pattern diffusion region;
   at least one guard band conforming to a shape of the active layer, the at least one guard band comprising a dummy diffusion layer, wherein the guard band is spaced from the active layer at a first constant spacing in a X-axis direction and a second constant spacing in a Y-axis direction, which is perpendicular to the X-axis direction; and
   a plurality of dummy diffusion patterns outside the at least one guard band.

2. The chip of claim 1, wherein the at least one guard band is free of convex corners.

3. The chip of claim 1, further comprising a block layer between the active layer and the at least one guard band, wherein the block layer is free of dummy diffusion layers.

4. The chip of claim 1, wherein at least one of the plurality of dummy diffusion patterns has a different granularity than at least another of the plurality of dummy diffusion patterns.

5. The chip of claim 1, wherein each of the plurality of dummy diffusion patterns has a same granularity.

6. The chip of claim 1, wherein the plurality of dummy diffusion patterns are distributed so that a diffusion density is substantially uniform over the chip.

7. The chip of claim 1, wherein the at least one guard band has a uniform width.

8. A chip having an integrated circuit structure comprising:
   a plurality of active layers, each active layer comprising an active pattern having a diffusion region;
   a plurality of guard bands, at least one guard band of the plurality of guard bands conforming to a shape of each active layer, wherein each guard band of the plurality of guard bands is a dummy diffusion layer, said each guard band surrounds the active layer without a break, said each guard band is spaced from an associated active layer at a first constant spacing in a X-axis direction and at a second constant spacing in a Y-axis direction, which is perpendicular to the X-axis direction, and said each guard band has a length less than a specified length; and
   a plurality of dummy diffusion patterns on the chip outside the plurality of guard bands.

9. The chip of claim 8, wherein each of the plurality of guard bands is free of convex corners.

10. The chip of claim 8, further comprising a block layer between the associated active layer and the at least one guard band, wherein the block layer is free of dummy diffusion layers.

11. The chip of claim 8, wherein at least one of the plurality of dummy diffusion patterns has a different granularity than at least another of the plurality of dummy diffusion patterns.

12. The chip of claim 8, wherein each of the plurality of dummy diffusion patterns has a same granularity.

13. The chip of claim 8, wherein the plurality of dummy diffusion patterns are distributed so that a diffusion density is substantially uniform over the chip.

14. The chip of claim 8, wherein each of the plurality of guard bands has a uniform width.

15. A chip having an integrated circuit structure comprising:
   an active layer comprising an active pattern having a diffusion region;
   at least one guard band conforming to a shape of the active layer, wherein the guard band is a dummy diffusion layer, the guard band surrounds the active layer, the guard band is spaced from the active layer at a first constant spacing in a X-axis direction and at a second constant spacing in a Y-axis direction, which is perpendicular to the X-axis direction, and the at least one guard band is free of convex corners; and
   a plurality of dummy diffusion patterns in a space of the chip outside the at least one guard band.

16. The chip of claim 15, further comprising a block layer between the active layer and the at least one guard band, wherein the block layer is free of dummy diffusion layers.

17. The chip of claim 15, wherein at least one of the plurality of dummy diffusion patterns has a different granularity than at least another of the plurality of dummy diffusion patterns.

18. The chip of claim 15, wherein each of the plurality of dummy diffusion patterns has a same granularity.

19. The chip of claim 15, wherein the plurality of dummy diffusion patterns are distributed so that a diffusion density is substantially uniform over the chip.

20. The chip of claim 15, wherein the at least one guard band has a uniform width.

* * * * *